United States Patent
Mahatme et al.

(10) Patent No.: US 10,921,390 B2
(45) Date of Patent: Feb. 16, 2021

(54) MAGNETIC ATTACK DETECTION IN A MAGNETIC RANDOM ACCESS MEMORY (MRAM)

(71) Applicant: NXP USA, Inc., Austin, TX (US)

(72) Inventors: Nihaar N. Mahatme, Austin, TX (US); Mehul D. Shroff, Austin, TX (US)

(73) Assignee: NXP USA, Inc., Austin, TX (US)

( * ) Notice: Subject to any disclaimer, the term of this patent is extended or adjusted under 35 U.S.C. 154(b) by 59 days.

(21) Appl. No.: 16/427,478

(22) Filed: May 31, 2019

(65) Prior Publication Data
US 2020/0379063 A1   Dec. 3, 2020

(51) Int. Cl.
| G11C 11/16 | (2006.01) |
| G01R 33/07 | (2006.01) |
| G11C 11/155 | (2006.01) |
| G11C 14/00 | (2006.01) |

(52) U.S. Cl.
CPC .......... *G01R 33/072* (2013.01); *G11C 11/155* (2013.01); *G11C 11/16* (2013.01); *G11C 14/0081* (2013.01)

(58) Field of Classification Search
CPC ....... G01R 33/072; G11C 11/16; G11C 11/00; G11C 11/155; G11C 14/0081
See application file for complete search history.

(56) References Cited

U.S. PATENT DOCUMENTS

| 6,999,339 B2 | 2/2006 | Tuttle et al. |
| 7,635,993 B2 | 12/2009 | Boeve |
| 9,355,044 B2 * | 5/2016 | Chan .................. G06F 3/0653 |
| 10,529,400 B1 * | 1/2020 | Mahatme .............. G11C 29/24 |
| 10,762,942 B1 * | 9/2020 | Katti .................. G11C 11/1673 |
| 2006/0262585 A1 | 11/2006 | Lenssen |
| 2015/0354985 A1 | 12/2015 | Judkins, III et al. |
| 2016/0163254 A1 | 6/2016 | Lee et al. |
| 2020/0150735 A1 * | 5/2020 | Agrawal .......... H04W 52/0293 |
| 2020/0309813 A1 * | 10/2020 | Katti .................. G01R 15/202 |

FOREIGN PATENT DOCUMENTS

| JP | 2004-303382 A | 10/2004 |
| WO | WO2004032146 A2 | 4/2004 |

OTHER PUBLICATIONS

Honeywell: "MRAM Application Note: AN-316 Stray Magnetic Fields (SMFs): Introduction and Product Handling Guidelines", Production—Release—Sep. 19, 2014 06:35:34 MST—Printed on Oct. 8, 2014, www.honeywellmicroelectronics.com, pp. 1-4.

Jang et al.: "Self-Correcting STTRAM under Magnetic Field Attacks", 2015 52nd ACM/EDAC/IEEE Design Automation Conference (DAC), Jun. 8-12, 2015, San Francisco, CA, USA, pp. 1-6.

(Continued)

*Primary Examiner* — Gene N Auduong

(57) ABSTRACT

An integrated circuit includes a magneto resistive RAM (MRAM) array having a plurality of MRAM cells, and a set of at least one Hall sensor circuit, each of the set including a Hall sensor to detect a magnetic field. The integrated circuit also includes magnetic processing circuitry for receiving at least one indication from the set of at least one Hall sensor circuit. The magnetic processing circuitry including an output to provide an indication of a possible magnetic field threat to the MRAM array based on the at least one indication from the set.

20 Claims, 4 Drawing Sheets

(56) References Cited

OTHER PUBLICATIONS

Nowak et al.: "Dependence of Voltage and Size on Write Error Rates in Spin-Transfer Torque Magnetic Random-Access Memory", IEEE Magnetics Letters, vol. 7 (2016), 3102604, pp. 1-4.
U.S. Appl. No. 16/047,077, Mahatme, Nihaar N.: "Magnetic Attack Detection in a Magnetic Random Access Memory (MRAM)", filed Jul. 27, 2018.
Wang et al.: "Impact of external magnetic field on embedded perpendicular STT-MRAM technology qualified for solder reflow", 978-1-5386-3559-9/17/$31.00 © 2017 IEEE, pp. 21.1.1-21.1.4, IEDM17-513-IEDM17-516.

* cited by examiner

MAGNETIC ATTACK DETECTION IN A MAGNETIC RANDOM ACCESS MEMORY (MRAM)

BACKGROUND

Field

This disclosure relates generally to memories, and more specifically, to detecting magnetic attacks in a Magnetic Random Access Memory (MRAM).

Related Art

Magnetic Random Access Memories (MRAMs) are typically used to provide non-volatile storage in which the direction of spin of magnetic moments encodes stored data states. The magnetic element of an MRAM cell is the Magnetic Tunnel Junction (MTJ). For example, when the magnetic moments of the interacting magnetic layers of the MTJ are aligned, a low resistance state is stored, corresponding to a "0", and conversely, when the moments are misaligned, a high resistance is stored, corresponding to a "1". In order to switch the MTJ from one state to another, the energy barrier (Eb) between the two states must be overcome. This can be accomplished by passing current through the MRAM cell in different directions. Magnetic fields near the MRAM cell are a risk to the integrity of the stored data since they can result in inadvertently switching the state of the MRAM cell. Therefore, a need exists for detecting external magnetic fields which can threaten the data integrity of an MRAM.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In an integrated circuit having an MRAM, Hall sensor circuits are used to detect external magnetic fields which can threaten the data integrity of an MRAM. A Hall sensor circuit is one which includes a Hall element, which causes variation in voltage in the presence of a magnetic field. Therefore, an output voltage of the Hall sensor circuit varies in response to a magnetic field, in which the output voltage varies proportionally with the strength of the magnetic field. A sensor processing circuit provides one or more attack indicators corresponding to each of the Hall sensor circuits which, when asserted, indicates a possible magnetic field threat. Assertion of the attack indicators is based on both the strength and duration of a detected magnetic field. Some Hall sensor circuits are placed in various locations within the MRAM, and thus are referred to as MRAM Hall sensor (MHS) circuits. Other Hall sensor circuits are placed in various locations on the chip, outside the MRAM, and thus are referred to as general Hall sensor (GHS) circuits.

Figure 1:
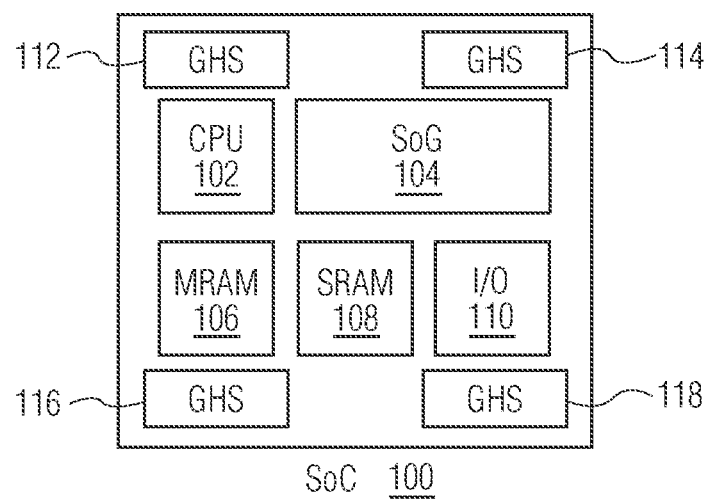
FIG. 1 illustrates, in block diagram form, an integrated circuit, corresponding to a System on a Chip (SoC), having a plurality of general Hall sensor (GHS) circuits in accordance with one embodiment of the present invention.

FIG. 1 illustrates an integrated circuit (IC) 100 which may be, for example, an SoC. IC 100 includes a central processing unit (CPU) 102, a sea of gates (SoG) 104, an MRAM 106, a static random access memory (SRAM) 108, and input/output (I/O) circuits 110. The elements of the SoC of FIG. 1 operate as known in the art, and may be arranged in any configuration. Also, a fewer or greater number of elements of modules may be present in IC 100. IC 100 also includes GHS circuits 112, 114, 116, and 118, which, as will be described below, detect magnetic fields. In the illustrated embodiment, there are four GHS sensors which are placed at the four corners of the chip for spatial coverage. Alternatively, other arrangements can be implemented, as needed, in which fewer or more GHS circuits may be placed in IC 100.

Figure 2:
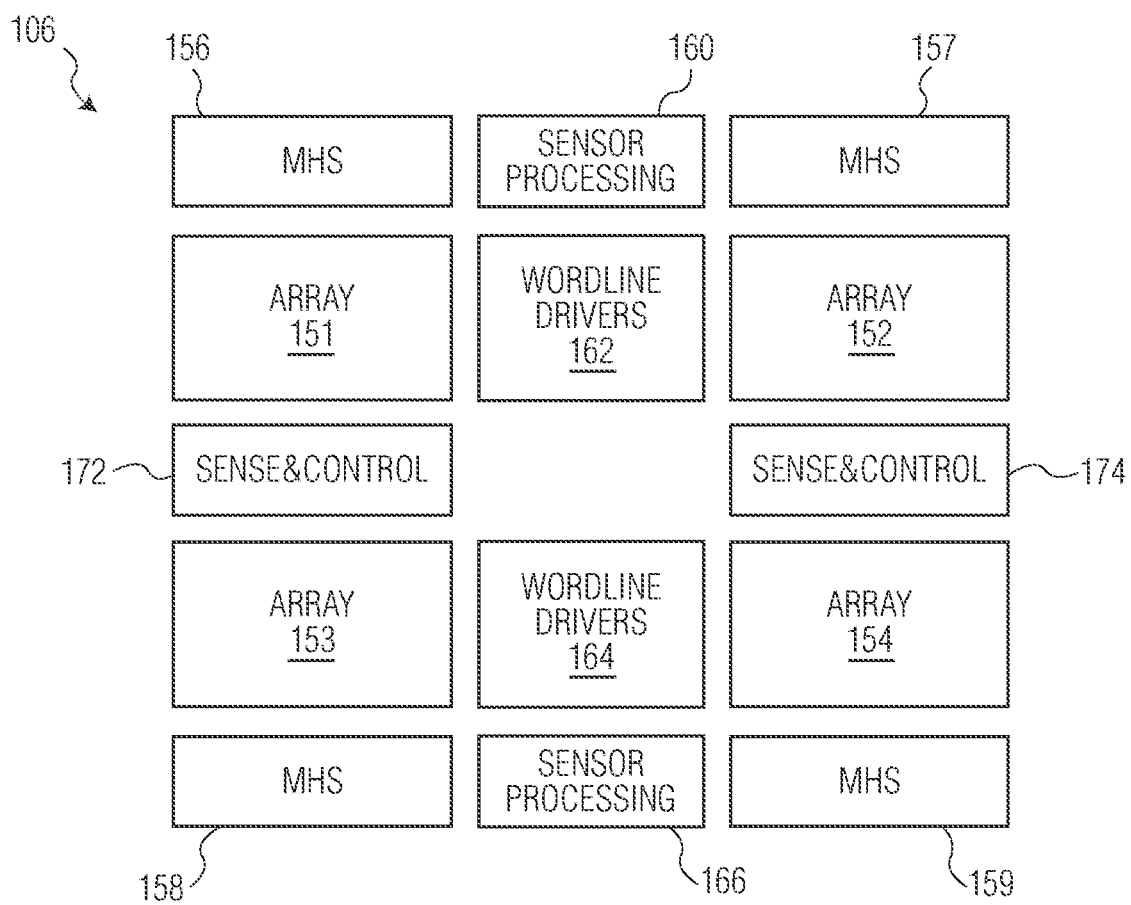
FIG. 2 illustrates, in block diagram form, an MRAM with MRAM Hall sensor (MHS) circuits, in accordance with one embodiment of the present invention.

FIG. 2 illustrates, in block diagram form, an MRAM 106 in accordance with one embodiment of the present invention which includes MHS circuits 156-159. MRAM 106 includes arrays 151-154, word line drivers (WD) 162 corresponding to arrays 151 and 152, and WD drivers 164 corresponding to arrays 153 and 154. MRAM 106 also includes sense and control circuit 172 corresponding to each of array 151 and 153, and a sense and control circuit 174 corresponding to each of array 152 and 154. Sense and control circuits of FIG. 2 include circuits required to read and write to arrays 151-154, such as column multiplexers, sense amplifiers, input/output (I/O) drivers, latches, and any other circuit required for the read and writes. MRAM 106 may also include sensor processing circuits 160 and 166 which process inputs received from MHS circuits 156-159. The MHS circuits are placed at the four corners of MRAM 106, but may be placed in different arrangements, as needed, including fewer or more MHS circuits. Therefore, in one embodiment, IC 100 includes a set of at least one Hall sensor circuit, and it can include any combination of MHS and GHS circuits. In one embodiment, different Hall sensors of the Hall sensor circuits have different levels of magnetic sensitivity. For example, Hall sensors of the MHS circuits may have a greater or lower magnetic sensitivity than those of the GHS circuits.

Arrays 101-104 of MRAM 106 each includes MRAM cells which store the MRAM data, and thus may be referred to as the data arrays. The MRAM data is accessed by any master requesting to read or write data to the MRAM array. Any MRAM cell in arrays 101-104 is susceptible to magnetic fields in which a magnetic field threat or attack can compromise the data integrity of any of the data arrays. Note that MRAM 106, with the exception of sensor processing circuits 160 and 166 and MHS circuits 156-159, operate as known in the art. Alternate embodiments may have different MRAM layouts than that of FIG. 2 and may distribute any number of MHS circuits in any way throughout the MRAM arrays.

Figure 3:
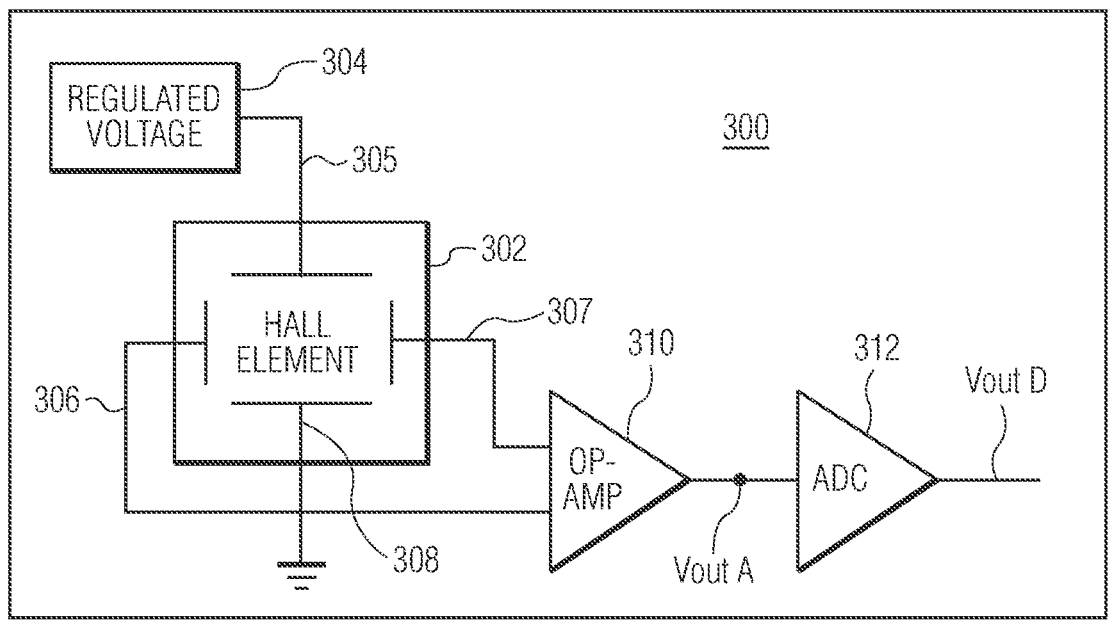
FIG. 3 illustrates, in block diagram form, a Hall sensor circuit, in accordance with one embodiment of the present invention.

FIG. 3 illustrates, in block diagram form, a Hall sensor circuit 300, in accordance with one embodiment of the present invention. Hall sensor circuit 300 may be used as any of the GHS or MHS circuits described herein. Hall sensor circuit 300 includes a Hall element 302, an operation amplifier (op-amp) 312, and an analog-to-digital converter (ADC) 312. Hall element 302 has four terminals. Two of the terminals, terminals 305 and 308, are coupled between a regulated voltage 304 and ground, so as to produce a current through Hall element 302. Terminals 306 and 307 provide a Hall voltage to op-amp 310, which amplifies the voltage to provide an analog output voltage, VoutA. ADC 312 receives VoutA and provides a corresponding digital code, VoutD, for VoutA. Hall element 302 is a four-terminal device in which current flows through two of the terminals (terminals 305 and 308), and when a magnetic field is applied, the motion of the carriers in the Hall element is diverted, resulting in the output voltage at the other two terminals (terminals 306 and 307). As magnetic fields are applied to (detected by) Hall element 302, the output voltage of the Hall element varies. As the strength or magnitude in the detected magnetic field increases, so does the output voltage of the Hall element, and consequently, VoutA and VoutD. That is, the Hall output voltage, VoutA, and VoutD all vary proportionally with the magnitude of a detected magnetic field. In an alternate embodiment, only VoutA may be provided as the output of Hall sensor circuit 300, without VoutD, if further processing does not require the digital version.

Figure 4:
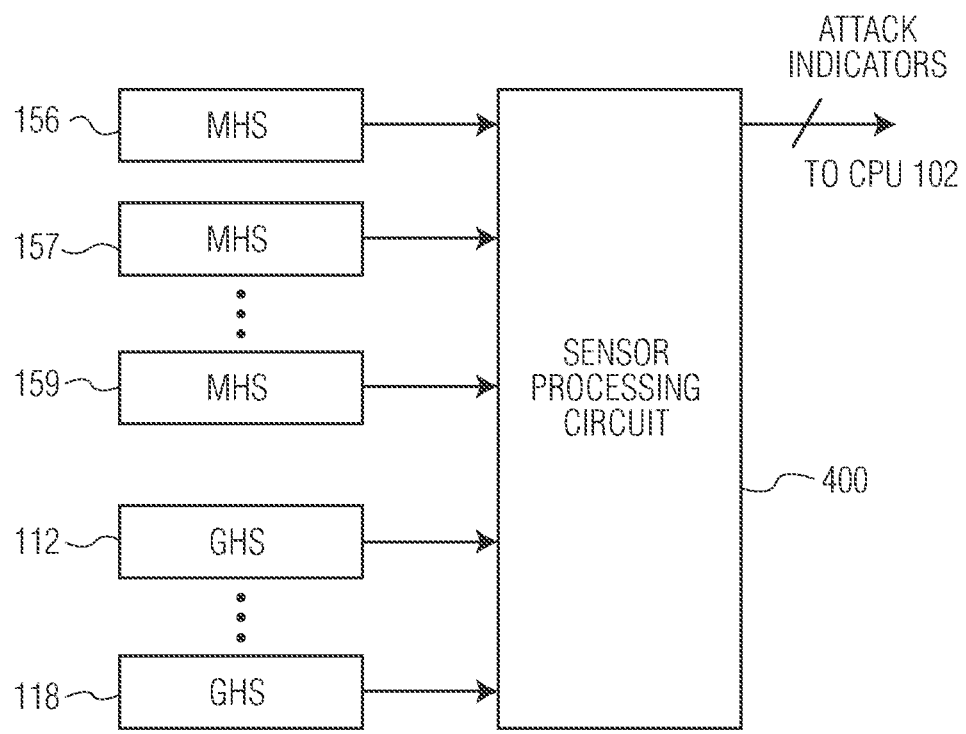
FIG. 4 illustrates, in block diagram form, a sensor processing circuit integrated circuit 100, in accordance with one embodiment of the present invention.

FIG. 4 illustrates, in block diagram form, a sensor processing circuit 400, in accordance with one embodiment of the present invention. Sensor processor circuit 400 receives an output from each MHS (such as MHS 156-159) and each GHS (such as GHS 112, 114, 116, and 118), in which, in one embodiment, each MHS and each GHS includes a single Hall sensor. The outputs may correspond, for example, to VoutD of each Hall sensor circuit, or alternatively, to VoutA of each Hall sensor circuit. The outputs are then processed by circuit 400 to provide attack indicators back to CPU 102. When sensor processing circuit 400 detects that an output of a Hall sensor circuit indicates at least a threshold magnitude (i.e. strength) of a magnetic field for at least a predetermined amount of time, sensor processing circuit 400 asserts a corresponding attack indicator. Sensor processing circuit 400 may be its own block in IC 100, or may be located in MRAM 106, such as illustrated in FIG. 2 with sensor processing circuits 160 and 166. Sensor processing circuit 400 may also be distributed, such that, for example, outputs from GHS circuits are processed by a first distributed portion of sensor processing circuit 400, outputs from some MHS circuits are processed by sensor processing circuit 160, and outputs from other MHS circuits are processed by sensor processing circuit 166. The attack indicators are provided to CPU 102 and, when an attack indicator is asserted, indicates to CPU 102 that there is a possible magnetic field threat to MRAM 106.

Figure 5:
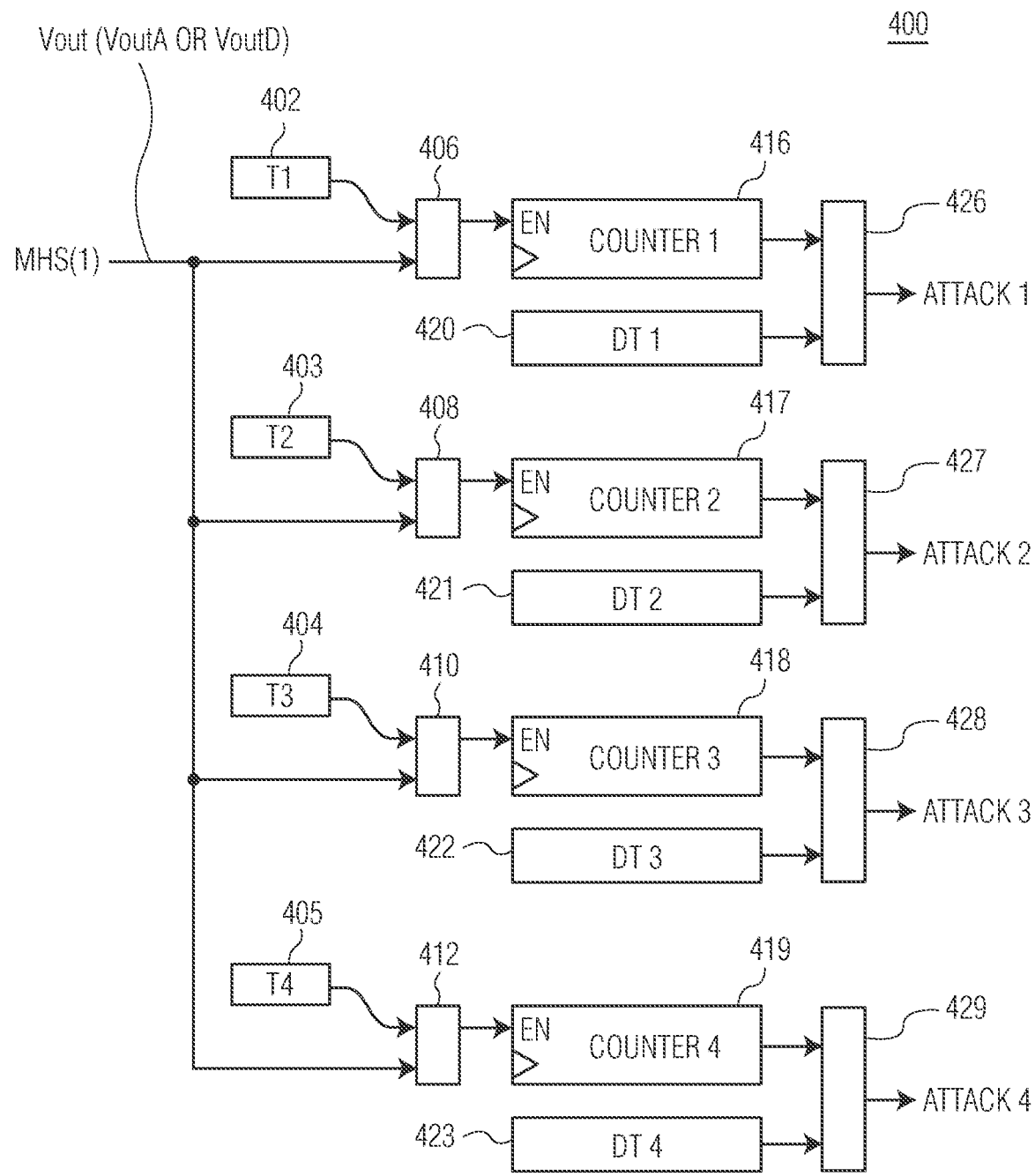
FIG. 5, illustrates, in block diagram form, the sensor processor circuit of FIG. 4, in accordance with one embodiment of the present invention.

FIG. 5 illustrates a portion of sensor processing circuit 400 of FIG. 4 which processes the output, Vout, from MHS 156. In this embodiment, MHS 156 includes a single Hall sensor circuit. Also, in this embodiment, Vout is VoutD from MHS 156 in which sensor processing circuit 400 processes a digital code or signal. In an alternate embodiment which processes an analog signal instead, Vout may be VoutA. Sensor processing circuit 400 includes storage circuitry 402-405 which stores a set of four magnitude thresholds, T1-T4, respectively, corresponding to MHS 156. Each magnitude threshold indicates a magnetic field magnitude (i.e. strength). In one embodiment, T1 to T4 represent increasing magnitude thresholds. Sensor processing circuit 400 also includes storage circuitry 420-423 which stores a set of four duration thresholds, DT1-DT4, respectively, corresponding to each of magnitude thresholds T1-T4, respectively. Sensor processing circuit 400 includes comparators 406, 408, 412, and 414, which compare Vout to thresholds T1-T4, respectively.

Sensor processing circuit 400 also includes counter1 416-counter4 419, in which each counter receives, at an enable input, an output from a corresponding comparator of comparators 406, 408, 410, and 412, respectively. For example, comparator 406 compares the digital value provided by Vout to T1, and if Vout is greater than T1, comparator enables counter1 416 to count, based on an input clock (with the clock indicated by a sideways arrow on the left side of each counter). Sensor processing circuit 400 also includes comparators 426-429 which compare a count value of each counter to a corresponding duration threshold, DT1-DT4, respectively, and outputs a corresponding attack indicator. For example, comparator 426 compares the count value of counter1 416 (which is increased while Vout is greater than TI) to DT1, and if the count value is greater than DT1, comparator 426 asserts attack 1. Note that, in a similar manner, attack 2 is asserted when Vout exceeds T2 for at least a duration of time indicated by DT2, attack 3 is asserted when Vout exceeds T3 for at least a duration of time indicated by DT4, and attack 4 is asserted when Vout exceeds T4 for at least a duration of time indicated by DT4. Attack 1-attack 4 correspond to attack indicators, and an asserted attack indicator indicates a possible magnetic field threat to MRAM 106. The magnitude thresholds can be set at increasing values such that assertion of attack 4 is more severe than assertion of attack 3 which is more severe than assertion of attack 2, which is more severe than assertion of attack 1, due to the detected magnetic field being increasingly stronger with each threshold.

Although only four magnitude and duration thresholds are illustrated for MHS 156, any number of magnitude and duration thresholds (including only one magnitude threshold and corresponding duration threshold) can be used and stored within storage circuitry of sensor processing circuit 400 (or storage circuitry anywhere in IC 100), and having corresponding counters and comparators, as needed. Sensor processing circuit 400 includes circuitry similar to that illustrated in FIG. 5 for each Hall sensor circuit. In one embodiment, the same thresholds (T1-T4 and DT1-DT4) are used for all the MHS and GHS circuits, but alternatively, a different set of magnitude and duration thresholds may be used for the GHS circuits versus the MHS circuits. In this way, each Hall sensor circuit provides a set of attack indicators (in which the number of attack indicators corresponds to the number of magnitude thresholds) to indicate possible magnetic field threats to the MRAM 106. If the set of attack indicators includes more than one, then the different magnitude thresholds allow for a corresponding threat level of the possible magnetic field threat, as described above in reference to the increasing threat levels of attack 1-attack 4 for MHS 156.

In an alternate embodiment, the circuitry of FIG. 5 may operate on VoutA rather than VoutD. For example, instead of digital comparators 406, 408, 410, and 412, analog comparators may be used, in which, for each comparator, VoutA is provided to a first input and a reference voltage is provided to a second input. The reference voltage of each comparator can be an increasingly greater value, representing the magnitude thresholds. In this embodiment, note that ADC 312 in the Hall sensor circuits would not be required.

However, additional circuitry may be needed in sensor processing circuit 400 to process the received analog signals.

Figure 6:
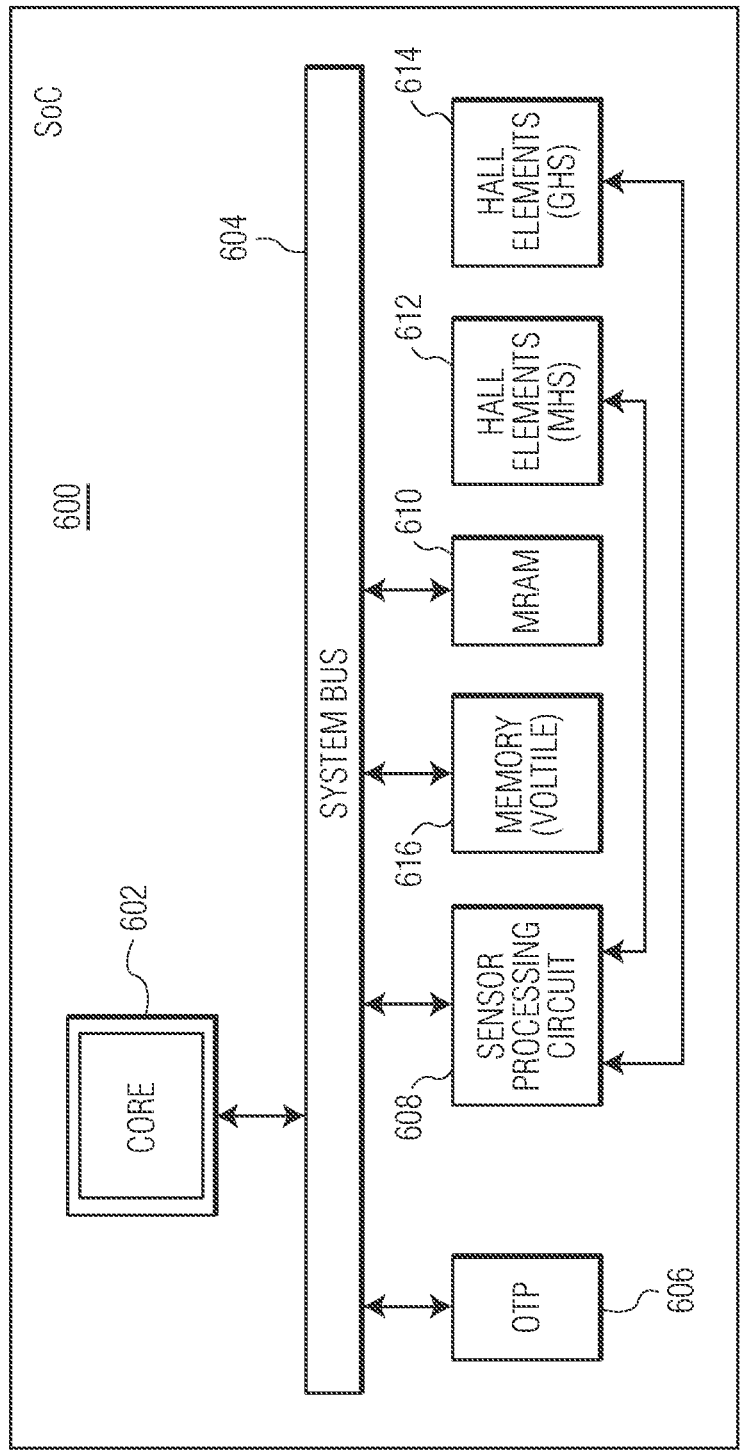
FIG. 6 illustrates, in block diagram from, a System on Chip (SoC) having the MRAM of FIG. 2, sensor processing circuit of FIG. 4, as well as the GHS and MHS circuits, in accordance with one embodiment of the present invention.

FIG. 6 illustrates a data processing system 600 (also referred to as a system on a chip (SoC)) which includes an MRAM 610, in accordance with one embodiment of the present invention. System 600 includes a core 602, a one-time programmable memory (OTP) 606, a sensor processing circuit 608, a memory 616 (which may be a volatile memory), MRAM 610, Hall elements 612 within MHS sensor circuits, and Hall elements 614 within GHS sensor circuits. Core 602, OTP 606, sensor processing circuit 608, memory 616, and MRAM 610 are each bidirectionally coupled via a system bus 604. In alternate embodiments, system bus 604 may be any type of system interconnect. System 200 may include more or fewer elements, as needed. MRAM 610 can be any MRAM, such as MRAM 106 described above, in which Hall elements 612 reside inside MRAM 610. Also, sensor processing circuit 608 may be sensor processing circuit 400, and as described above, may be located anywhere on the SoC, or may be distributed in the SoC, in which portions may be located in MRAM 610.

In operation, the MHS and GHS sensor circuits for Hall elements 612 and 614 provide their corresponding outputs (e.g. VoutA or VoutD) to sensor processing circuit 608 via sideband signals, outside of system bus 604. Alternatively, these may be communicated as part of system bus 604. Sensor processing unit 608, in response, selectively asserts any attack indicators based on the magnitude and duration thresholds corresponding to the particular Hall sensor circuit. These attack indicators are provided to core 602 via system bus 604. In this manner, core 602 can reply as needed in response to the indicated possible threats.

An SoC with an MRAM (such as the SoC of IC 100 or SoC 600) may respond to the attack indicators from the Hall sensor circuits in many different ways to protect the MRAM or the SoC itself due to possible magnetic field threats. For example, in the case in which an attack indicator from a GHS circuit is asserted, an interrupt can be sent to the CPU or core to halt execution, and MRAM access can be firewalled. In the case in which an attack indicator from an MHS circuit is asserted, different actions can be performed based on a number of MHS circuits which asserted an attack indicator. In the case that only one MHS circuit resulted in an asserted attack indicator, a localized magnetic field threat or attack may be indicated. In this situation, execution from the MRAM is halted. Also, information about which block of MRAM is likely to have been corrupted can be logged in a non-volatile memory, such as in OTP memory 606. For example, the location of the single MHS which asserted an attack indicator may indicate that those MRAM blocks in close proximity to the MHS sensor is most likely affected while other portions of the MRAM are not. However, in the case that multiple MHS circuits asserted at least one corresponding attack indicator, a widespread magnetic field threat or attack may be indicated. In this situation, information as to which blocks of the MRAM are likely to be corrupted are stored in the non-volatile memory. Once any of the attack situations described herein have subsided, recovery actions may be performed. In alternate embodiments, the information from the Hall sensor circuits or the attack indicators from the sensor processing circuit may be used to formulate different or additional responses within the SoC, as desired.

Therefore, by now it can be understood how Hall elements within Hall sensor circuits integrated within an MRAM memory or an SoC or both in the MRAM and elsewhere in the SoC can be used to detect magnetic field threats to the MRAM memory. Through the use of different magnitude thresholds, a Hall sensor circuit can provide different attack indicators which correspond to various levels of magnetic field threats, and accordingly, different actions may be taken in response to the attack indicators. The use of duration thresholds can also ensure that a magnetic field of at least a minimum magnitude threshold is detected for at least a predetermined amount of time before asserting an attack indicator. In this manner, minor or fast appearances of a magnetic field do not trigger attack indicators, while those which are of a certain level for a certain amount of time do.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIGS. 1-5 and the discussion thereof describe exemplary architectures, these exemplary architectures are presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also, for example, in one embodiment, the illustrated elements of system 100 or 600 are circuitry located on a single integrated circuit or within a same device. Alternatively, system 100 or 600, if not an SoC, may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the Hall sensor circuits, including the GHS and MHS circuits, can be integrated in different patterns into the MRAM rather than those illustrated in FIGS. 1, 2, and 6. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes a magneto resistive RAM (MRAM) array comprising a plurality of MRAM cells; a set of at least one Hall sensor circuit, each of the set including a Hall sensor to detect a magnetic field; and magnetic processing circuitry for receiving at least one indication from the set of at least one Hall sensor circuit, wherein the magnetic processing circuitry including an output to provide an indication of a possible magnetic field threat to the MRAM array based on the at least one indication from the set. In one aspect of this embodiment, the magnetic processing circuitry provides an indication of a possible magnetic field threat to the MRAM array based on an indication from a single Hall sensor circuit of the set. In another aspect, the magnetic processing circuitry is configured to provide a second indication of a possible magnetic field threat to the MRAM array based on an indication from a single second Hall sensor circuit of the set. In a further aspect, the MRAM array is part of an MRAM circuit located in a first area of the integrated circuit, wherein the Hall sensor of the single Hall sensor circuit is located in first area within the MRAM circuit and the Hall sensor of the second Hall sensor circuit is not located in an area of the integrated circuit within the MRAM circuit. In yet a further aspect, a first portion of the magnetic processing circuitry is located in the first area of the integrated circuit, wherein a second part of the magnetic processing circuitry is located in a second area of the integrated circuit with the second Hall sensor circuit. In another aspect, the magnetic processing circuitry provides a second indication of a possible magnetic field threat to the MRAM array based on the indication from the single Hall sensor circuit of the set. In another aspect of the above embodiment, the indication is based on a detection of a magnetic field being at least at a threshold magnitude for a first predetermined amount of time. In a further aspect, the magnetic processing circuitry provides a second indication of a possible magnetic field threat, the second indication is based on a magnetic field being at least at a second threshold magnitude for a second predetermined amount of time, wherein the second threshold magnitude is greater than the threshold magnitude and the second predetermined amount of time is less than the first predetermined amount of time. In another aspect, the set includes a first Hall sensor having a first level of magnetic sensitivity, and a second hall sensor having second level of magnetic sensitivity greater than the first level of sensitivity. In another aspect, the magnetic processing circuitry includes a comparator for comparing an indication from the set of at least one Hall sensor circuit with a magnetic field threshold magnitude. In a further aspect, the processing circuitry includes a counter that counts an amount of time that an output of the comparator indicates that the indication from the set is above the magnetic field threshold magnitude.

In another embodiment, a method of operating an integrated circuit includes sensing with at least one Hall sensor of at least one Hall sensor circuit of an integrated circuit a magnetic field, the integrated circuit including a magneto resistive RAM (MRAM) array including a plurality of MRAM cells; and determining by magnetic processing circuitry of the integrated circuit whether to provide an indication of a possible magnetic field threat to the MRAM array based on the sensing. In one aspect of this another embodiment, the indication is based on a detection of a magnetic field by a Hall sensor of the at least on Hall sensor detecting a magnetic field being at least at a threshold magnitude for a predetermined amount of time. In another aspect, the method further includes determining by magnetic processing circuitry of the integrated circuit whether to provide a second indication of a possible magnetic field threat to the MRAM array. In a further aspect, the indication is based on a detection of a magnetic field by a Hall sensor of the at least one Hall sensor detecting a magnetic field being at least at a first threshold magnitude for a first predetermined amount of time, in which the second indication is based on a magnetic field being at least at a second threshold magnitude for a second predetermined amount of time, wherein the second threshold magnitude is greater than the first threshold magnitude. In a further aspect, the second predetermined amount of time is less than the first predetermined amount of time. In another aspect, the second indication is based on a detection of a magnetic field by the Hall sensor. In another aspect, the determining includes comparing with a comparator an output of a Hall sensor circuit of the at least one Hall sensor circuit with a threshold magnitude. In a further aspect, the method further includes counting with a counter an amount of time that the output of the Hall sensor circuit is above the threshold magnitude, wherein the indication is provided if the output is above the threshold magnitude for a predetermined amount of time. In yet another aspect, the method further includes halting execution of the MRAM array in response to the indication.

What is claimed is:

1. An integrated circuit comprising:
a magneto resistive RAM (MRAM) array comprising a plurality of MRAM cells;
a set of at least one Hall sensor circuit, each of the set including a Hall sensor to detect a magnetic field;
magnetic processing circuitry for receiving at least one indication from the set of at least one Hall sensor circuit, wherein the magnetic processing circuitry including an output to provide an indication of a possible magnetic field threat to the MRAM array based on the at least one indication from the set.

2. The integrated circuit of claim 1 wherein the magnetic processing circuitry provides an indication of a possible magnetic field threat to the MRAM array based on an indication from a single Hall sensor circuit of the set.

3. The integrated circuit of claim 2 wherein the magnetic processing circuitry is configured to provide a second indication of a possible magnetic field threat to the MRAM array based on an indication from a single second Hall sensor circuit of the set.

4. The integrated circuit of 3 wherein the MRAM array is part of an MRAM circuit located in a first area of the integrated circuit, wherein the Hall sensor of the single Hall sensor circuit is located in first area within the MRAM circuit and the Hall sensor of the second Hall sensor circuit is not located in an area of the integrated circuit within the MRAM circuit.

5. The integrated circuit of claim 4 wherein a first portion of the magnetic processing circuitry is located in the first area of the integrated circuit, wherein a second part of the magnetic processing circuitry is located in a second area of the integrated circuit with the second Hall sensor circuit.

6. The integrated circuit of claim 2 wherein the magnetic processing circuitry provides a second indication of a possible magnetic field threat to the MRAM array based on the indication from the single Hall sensor circuit of the set.

7. The integrated circuit of claim 1 wherein the indication is based on a detection of a magnetic field being at least at a threshold magnitude for a first predetermined amount of time.

8. The integrated circuit of claim 7 wherein the magnetic processing circuitry provides a second indication of a possible magnetic field threat, the second indication is based on a magnetic field being at least at a second threshold magnitude for a second predetermined amount of time, wherein the second threshold magnitude is greater than the threshold magnitude and the second predetermined amount of time is less than the first predetermined amount of time.

9. The integrated circuit of claim 1 wherein the set includes a first Hall sensor having a first level of magnetic sensitivity, and a second hall sensor having second level of magnetic sensitivity greater than the first level of sensitivity.

10. The integrated circuit of claim 1 wherein the magnetic processing circuitry includes a comparator for comparing an indication from the set of at least one Hall sensor circuit with a magnetic field threshold magnitude.

11. The integrated circuit of claim 10 wherein the processing circuitry includes a counter that counts an amount of time that an output of the comparator indicates that the indication from the set is above the magnetic field threshold magnitude.

12. A method of operating an integrated circuit, comprising:
sensing with at least one Hall sensor of at least one Hall sensor circuit of an integrated circuit a magnetic field, the integrated circuit including a magneto resistive RAM (MRAM) array including a plurality of MRAM cells;
determining by magnetic processing circuitry of the integrated circuit whether to provide an indication of a possible magnetic field threat to the MRAM array based on the sensing.

13. The method of claim 12 wherein the indication is based on a detection of a magnetic field by a Hall sensor of the at least on Hall sensor detecting a magnetic field being at least at a threshold magnitude for a predetermined amount of time.

14. The method of claim 12 further comprising:
determining by magnetic processing circuitry of the integrated circuit whether to provide a second indication of a possible magnetic field threat to the MRAM array.

15. The method of claim 14 wherein:
the indication is based on a detection of a magnetic field by a Hall sensor of the at least one Hall sensor detecting a magnetic field being at least at a first threshold magnitude for a first predetermined amount of time;
wherein the second indication is based on a magnetic field being at least at a second threshold magnitude for a second predetermined amount of time, wherein the second threshold magnitude is greater than the first threshold magnitude.

16. The method of claim 15 wherein the second predetermined amount of time is less than the first predetermined amount of time.

17. The method of claim 15 wherein the second indication is based on a detection of a magnetic field by the Hall sensor.

18. The method of claim 12 wherein the determining includes comparing with a comparator an output of a Hall sensor circuit of the at least one Hall sensor circuit with a threshold magnitude.

19. The method of claim 18 further comprising:
counting with a counter an amount of time that the output of the Hall sensor circuit is above the threshold magnitude, wherein the indication is provided if the output is above the threshold magnitude for a predetermined amount of time.

20. The method of claim 12 further comprising:
halting execution of the MRAM array in response to the indication.

* * * * *